United States Patent
Kwa

(10) Patent No.: US 9,804,046 B2
(45) Date of Patent: Oct. 31, 2017

(54) PRESSURE SENSOR WITH SUPPORT STRUCTURE FOR NON-SILICON DIAPHRAGM

(71) Applicant: DunAn Sensing, LLC, San Jose, CA (US)

(72) Inventor: Tom Kwa, San Jose, CA (US)

(73) Assignee: DUNAN SENSING, LLC, San Jose, CA (US)

( * ) Notice: Subject to any disclaimer, the term of this patent is extended or adjusted under 35 U.S.C. 154(b) by 36 days.

(21) Appl. No.: 14/924,631

(22) Filed: Oct. 27, 2015

(65) Prior Publication Data
US 2017/0115175 A1    Apr. 27, 2017

(51) Int. Cl.
G01L 9/00    (2006.01)
B81C 1/00    (2006.01)

(52) U.S. Cl.
CPC ........ *G01L 9/0052* (2013.01); *B81C 1/00158* (2013.01); *G01L 9/0054* (2013.01); *B81C 1/00523* (2013.01); *B81C 1/00626* (2013.01); *B81C 1/00785* (2013.01)

(58) Field of Classification Search
None
See application file for complete search history.

(56) References Cited

U.S. PATENT DOCUMENTS

| 4,592,238 | A | * | 6/1986 | Busta | B81C 1/00158 29/621.1 |
| 4,651,120 | A | * | 3/1987 | Aagard | G01L 9/0054 29/25.35 |
| 4,771,638 | A | * | 9/1988 | Sugiyama | G01L 9/0042 338/4 |
| 5,589,810 | A | * | 12/1996 | Fung | G01L 9/0055 338/4 |
| 5,706,565 | A | * | 1/1998 | Sparks | G01L 9/0073 29/25.42 |
| 6,912,759 | B2 | * | 7/2005 | Izadnegahdar | G01L 9/0055 216/56 |
| 7,111,518 | B1 | | 9/2006 | Allen et al. | |
| 7,192,819 | B1 | * | 3/2007 | Padmanabhan | B81C 1/00158 257/19 |

(Continued)

OTHER PUBLICATIONS

Acuity Incorporated, *Acuity Series AC3050 10 mbar Very Low Pressure Sensor Die*, 2pp, © Acuity Incorporated 2009-2014, Fremont, California 94539, USA, V1416 Info@acuitymicro.com.

(Continued)

*Primary Examiner* — Andre Allen
(74) *Attorney, Agent, or Firm* — Hackler Daghighian Martino & Novak

(57) ABSTRACT

A pressure sensor and methods of making a pressure sensor are described. In preferred embodiments, the pressure sensor is designed for low-pressure and high-sensitivity applications. In some embodiments, the pressure sensor comprises: a frame made from a single-crystal silicon starting material, the frame surrounding a cavity; a diaphragm that covers the cavity, the diaphragm constructed from a separate layer of material deposited on the single-crystal silicon starting material; a support structure that spans the diaphragm wherein the support structure is formed from the single-crystal starting material; and, a piezoresistor formed across an intersection of the frame and the support structure.

24 Claims, 7 Drawing Sheets

(56) References Cited

U.S. PATENT DOCUMENTS

| | | | |
|---|---|---|---|
| 2010/0031752 A1* | 2/2010 | Delapierre | G01L 9/0044 |
| | | | 73/726 |
| 2013/0239700 A1* | 9/2013 | Benfield | G01L 5/162 |
| | | | 73/862.044 |
| 2015/0192486 A1 | 7/2015 | Stewart et al. | |
| 2015/0192487 A1 | 7/2015 | Belov et al. | |
| 2016/0146685 A1 | 5/2016 | Chiou et al. | |

OTHER PUBLICATIONS

All Sensors, *MEMS Piezoresistive Low Pressure Sensing Die*, 2 pp, All Sensors, DS-0287 Rev A, All Sensors, Morgan Hill, CA 95037, www.allsensors.com.

Silicon Microstructures, Inc., Doc#: 40SP5008.03, *SM5103 OEM Silicon Pressure Die—SMi Pressure Sensors*, Product No. SM5103, 4 pp, © Copyright 2013, Silicon Microstructures, Inc., Milpitas, CA 95035, www.si-micro.com.

* cited by examiner

- Silicon
- P+
- P−
- Oxide
- Nitride
- Metal

PRESSURE SENSOR WITH SUPPORT STRUCTURE FOR NON-SILICON DIAPHRAGM

The present patent document relates to pressure sensors. More particularly, the present patent document relates to pressures sensors that use a diaphragm and a support structure for the diaphragm. Preferably, these pressure sensors are very sensitive and can detect very small changes in pressure.

BACKGROUND

Pressure sensors and pressure sensors that use the displacement of a diaphragm to measure pressure are known in the art. Piezoresistive pressure sensors are typically made by etching thin diaphragms into a silicon structure. These previous devices aim to measure low pressure with a thin, all-silicon diaphragm at the bottom of the cavity. Often, the design of all-silicon diaphragm pressure sensors require a thicker portion of the diaphragm located in the center of the diaphragm referred to as a boss. If a boss is used on the silicon diaphragm, the lateral dimensions of the boss must be very tightly controlled in order for the sensor to obtain the desired performance characteristics. Pressure sensors using this type of construction may be difficult and/or expensive to manufacture. Moreover, pressure sensors using an all-silicon diaphragm have numerous limitations including being limited to diameters of a millimeter or more and a practical minimum thickness of the silicon diaphragm of about 5 microns. The size and thickness limitations of the silicon diaphragm limit the sensor's sensitivity and performance characteristics and abilities.

SUMMARY OF THE EMBODIMENTS

In view of the foregoing, an object according to one aspect of the present patent document is to provide high-sensitivity pressure sensors that remedy or at least ameliorates some of the issues with previous sensor designs. In the embodiments described herein, rather than having a diaphragm made by reducing the thickness of the silicon layer, the pressure sensor has a diaphragm made out of a layer (such as silicon nitride) which is deposited over a cavity. One advantage of such embodiments is that such a layer may be easily deposited as thin a 2,000 Å (0.2 microns) or even as thin as 1,000 Å (0.1 microns) and with superior thickness control. Furthermore, in the embodiments described herein, the pressure sensor has a support structure made out of the single-crystal silicon starting material. Such embodiments may be made with no boss for which the lateral dimensions need to be tightly controlled.

To this end, a pressure sensor with a diaphragm formed from a deposited material is provided. In one embodiment, the pressure sensor comprises: a frame made from a single-crystal silicon starting material, the frame surrounding a cavity; a diaphragm that covers the cavity, the diaphragm constructed from a separate layer of material deposited on the single-crystal silicon starting material; a support structure that spans the diaphragm wherein the support structure is formed from the single-crystal starting material; and, a piezoresistor formed across an intersection of the frame and the support structure.

In preferred embodiments, the separate layer of material which forms the diaphragm is silicon nitride ($Si_3N_4$). However, in other embodiments, other suitable materials may be used.

In another aspect of the invention, the piezoresistor is formed in the single-crystal silicon material by implanting a P+ material or, a P+ material and a P− material in an N-type single-crystal silicon material. In yet other embodiments, the piezoresistor is formed in the single-crystal material by implanting an N+ or, an N+ and an N− material in a P-type substrate. In some embodiments, a piezoresistor is formed at each intersection of the support structure and the frame. Contacts may also be formed for electrically connecting the piezoresistors.

Although different types of starting materials may be used to form the pressure sensor, in preferred embodiments, the single-crystal starting material is part of a silicon-on-insulator (SOI) wafer. In embodiments using an SOI wafer, the cavity may be formed in the silicon on a first side of the insulator and the support structure may be formed in the silicon on a second opposite side of the insulator. In such an embodiment, the cavity may be etched into the bottom silicon layer and extend all the way to the insulator layer.

In embodiments incorporating an SOI wafer, preferably the support structure is formed from the silicon on a second opposite side of the insulator from the first side where the cavity is formed. The support structure spans the diaphragm and is formed by removing material, silicon and oxide, on the second opposite side of the SOI wafer above the cavity and leaving the support structure.

Depending on the embodiment and the requirements of the sensor, the design of the support structure or mechanical support/stop above the diaphragm may vary. In some embodiments, the support structure is comprised of two spans that span the diaphragm in perpendicular directions to each other. In yet another embodiment, the support structure comprises two spans in one direction and a third span in a second direction perpendicular to the first two spans. Often, the support structure includes at least one window where an internal portion of one of the support structure spans is removed. In some embodiments, the support structure may contain a plurality of windows with one of the windows positioned over the center of the diaphragm.

Depending on the embodiment, the size of the cavity and the diaphragm may vary in size along with their size with respect to each other. In preferred embodiments, the diaphragm is smaller than the cavity.

In another aspect of the invention, a method of manufacturing a pressure sensor is provided. In some embodiments, the method comprises: forming a cavity in a first side of a silicon starting material; depositing a layer of a second material over the cavity; removing material above the cavity from a second side opposite to the first side to form a diaphragm with at least one support structure that spans the diaphragm; and, forming at least one piezoresistor in the silicon starting material over an intersection of the support structure and the silicon starting material at an outside edge of the diaphragm on the second side.

Preferred embodiments of the method for forming the pressure sensor form it out of a silicon-on-insulator wafer. In such embodiments, the cavity may be formed by removing the silicon on a first side of the SOI wafer to a depth of the insulator. In order to form the diaphragm and the support structure in an SOI wafer, both the silicon and insulator above the cavity may be removed. Typically, the material removal is accomplished by etching wherein a mask is applied prior to the etch to define boundaries of the diaphragm and support structure.

As described more fully below, the apparatus and methods of the embodiments of a pressure sensor described herein offer benefits over previous designs. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed embodiments.

DETAILED DESCRIPTION OF THE EMBODIMENTS

Figure 1:
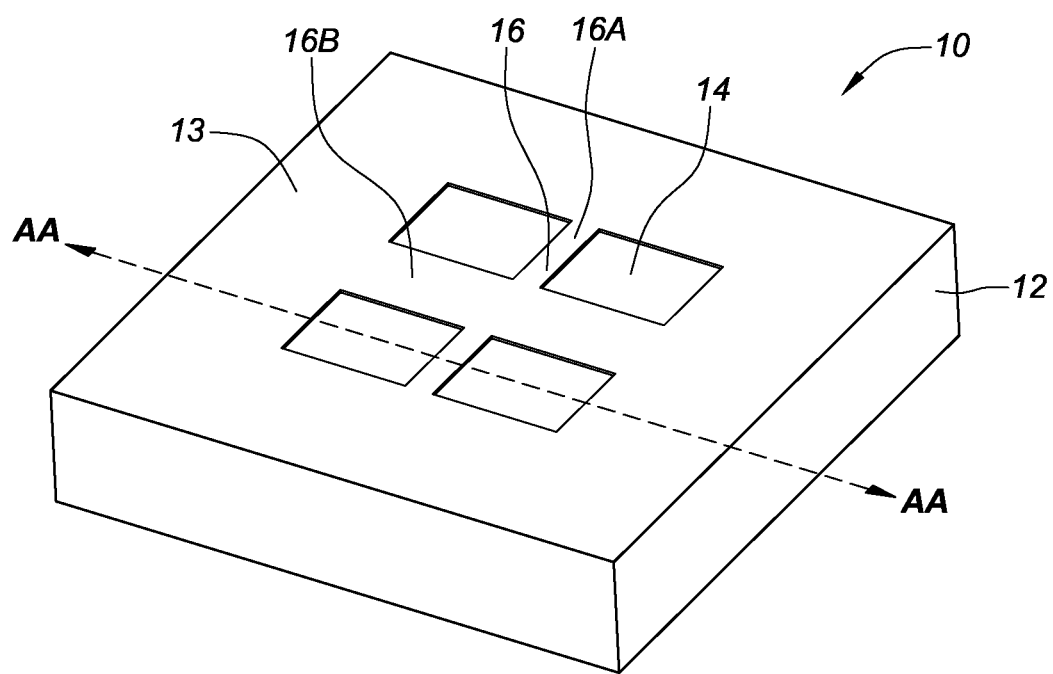
FIG. 1 illustrates an isometric view of one embodiment of a pressure sensor according to the teachings of the present patent document.
Figure 2:
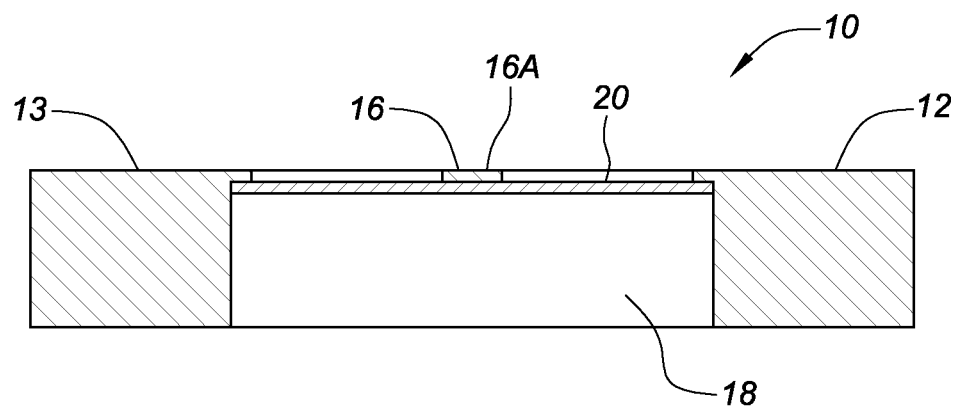
FIG. 2 illustrates the cross-section AA of FIG. 1.

FIG. 1 illustrates an isometric view of one embodiment of a pressure sensor 10 according to the teachings of the present patent document. FIG. 2 illustrates the cross-section AA of FIG. 1. The thicknesses in FIGS. 1 and 2 have been exaggerated to help illustrate the different components. As may be seen in FIGS. 1 and 2, the pressure sensor 10 includes a frame 13 formed around a cavity 18, a diaphragm 14 and a support structure 16 formed across the diaphragm 14.

The pressure sensor 10 of FIG. 1 includes a single-crystal silicon starting material 12. In preferred embodiments, the pressure sensor 10 is fabricated from a silicon-on-insulator (SOI) wafer. However, in other embodiments, other materials may be used.

As may be seen in FIG. 2, the pressure sensor 10 includes a cavity 18. In preferred embodiments, the cavity 18 is cut into the silicon from a first side of the material. In some embodiments, the cavity 18 may be formed by etching but in other embodiments other methods of material removal may be used.

As may also be seen in FIG. 2, a layer of a second material 20 is formed in the cavity 18. Once the material above this second material layer 20 is removed, the second material layer 20 forms a diaphragm 14. In the embodiment shown in FIG. 2, the second material layer 20 is only formed in the bottom of the cavity 18. However, in other embodiments, the second material layer 20 may be deposited over the entire side of the silicon containing the cavity 18.

In preferred embodiments, the second material layer 20 is made from a non-silicon material. One material that may be used for the second material layer 20 is silicon nitride ($Si_3N_4$). In other embodiments, other suitable materials may be used. As just a few examples, the second material layer 20 may be made from Diamond, Diamond-Like Carbon (DLC), SiC, $Al_2O_3$, ZnO, $Al_2O_3$/ZnO alloy, AN, Lead Zirconium Titanate (PZT), or TiNi to name a few.

One advantage to having the diaphragm 14 made from a layer that is deposited is that the thickness of the deposited layer may be more easily controlled. Moreover, the non-silicon deposited layer may be used as a positive etch stop to improve the thickness control of the diaphragm 14. In addition, thinner diaphragms may be constructed because the deposited layer may be made much thinner than a layer of etched silicon.

As mentioned above, the thicknesses of some elements, like the second material layer 20, has been exaggerated in FIGS. 1 and 2 for purposes of illustration and second material layer 20 may be considered a thin film. The thickness of the second material layer 20 may be varied according to design principles, material used, and the sensitivity requirements of the diaphragm 14. In preferred embodiments, the second material layer 20 may range in thickness from 1 micron to as thin as 1,000 Å (0.1 microns). In typical embodiments using silicon nitride, the thickness of the second layer 20 may be around 0.002 mm (0.2 microns) thick.

As may be seen by examining FIGS. 1 and 2, the diaphragm 14 is formed by the second material layer 20 when a portion of the material above the second material layer 20 over the cavity 18 is removed. Preferably, the diaphragm 14 is smaller than the size of the cavity 18. In the embodiments described herein, not all the material above diaphragm 14 is removed. Instead, some of the material is left behind to form a support structure 16. A may be seen in FIG. 1, the support structure 16 comprises two spans 16A and 16B. Each span 16A and 16B spans from one side of the diaphragm 14 to the other. In the embodiment show in FIG. 1, the spans 16A and 16B are perpendicular to each other to form a support structure 16 in the shape of a cross.

As explained above, preferably the support structure 16 is formed by leaving material behind when removing material above the second material layer 20 to form the diaphragm 14. To this end, the support structure is preferably one or more single-crystal silicon bridges that span the diaphragm 14. The support structure 16 acts primarily for mechanical support (to add stiffness to the thin diaphragm 14). However, a small fraction of the support structure 16 is used and essential for the transduction from strain to resistance change. These areas are located where the support structure intersects with the frame 13. In these junctions, piezoresistors are embedded in the support structure 16. In addition to having a mechanical function, these areas also have an electrical function. The remainder of the support structure only has a mechanical function.

Similar to the thickness of the diaphragm 14, the size and shape of the support structure 16 may be modified depending on the requirements of the sensor 10. The amount of silicon used as mechanical support needs 16 to be kept low enough not to compromise the device sensitivity but high enough so that it limits the displacement to within the linear range. Large displacement may result in high non-linearity and at the same time will contribute to the sensitivity of the device. As one skilled in the art will appreciate, there are many patterns to accomplish this.

Figure 3A:
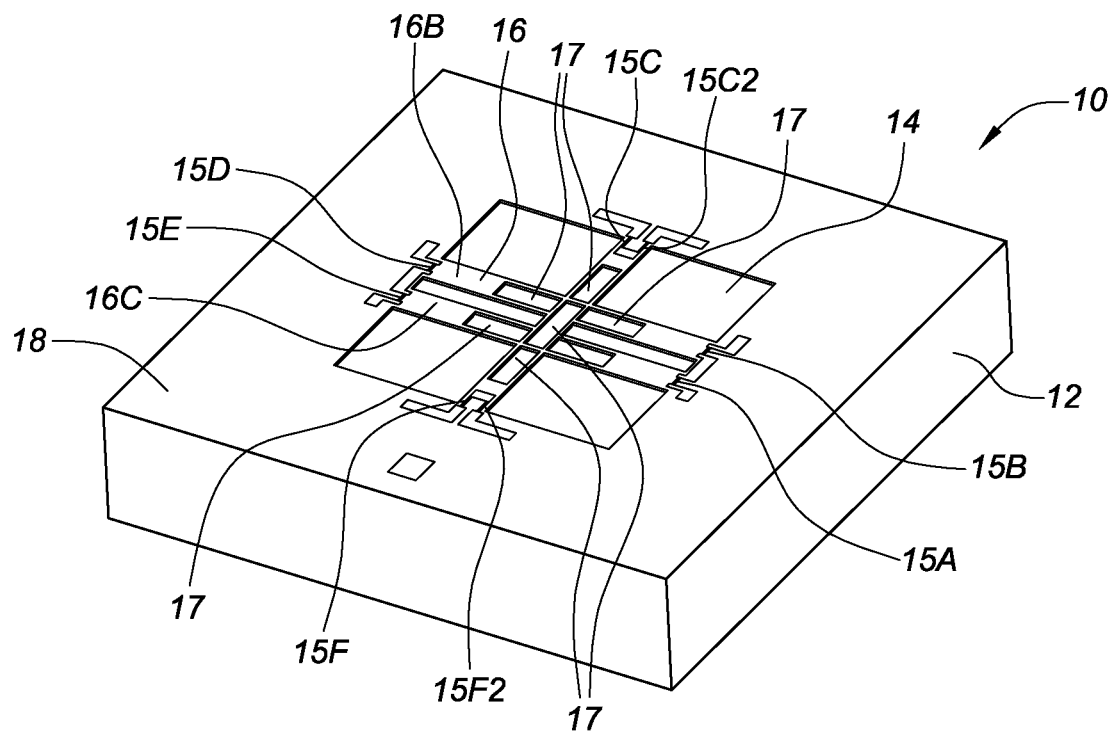
FIG. 3A illustrates a front isometric view of one embodiment of a pressure sensor according to the teachings herein with a more detailed support structure 16.
Figure 3B:
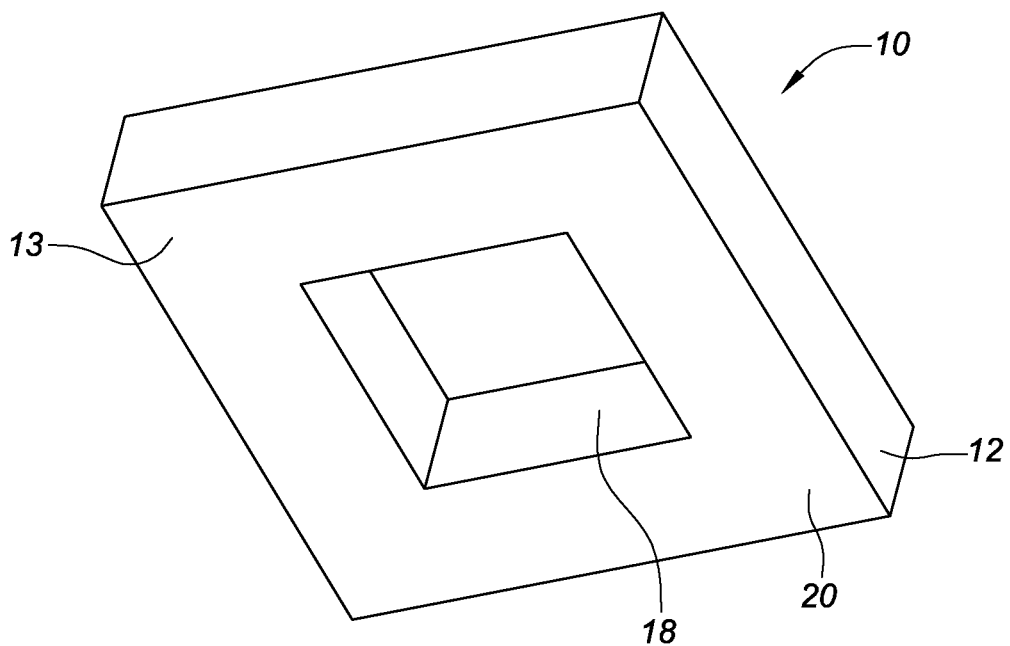
FIG. 3B illustrates a rear isometric view of the pressure sensor 10 of FIG. 3A

FIG. 3A illustrates a front isometric view of one embodiment of a pressure sensor 10 accordingly the teachings herein with a more detailed support structure 16. FIG. 3B illustrates a rear isometric view of the pressure sensor 10 of FIG. 3A. As may be seen in FIGS. 3A and 3B, the support structure 16 may have a more intricate design. In addition, FIG. 3A illustrates the piezoresistors 15A-15F. In the embodiment shown in FIG. 3A, two piezoresistors are placed on each of the four sides of the pressure sensor 10 where the support structure 16 intersects with the frame 13.

As may be seen in FIG. 3A, the support structure 16 has a first span or bridge 16A that spans from the frame 13 on one side of the diaphragm 14 to the frame 13 on the other side of the diaphragm 14. In addition, support structure 16 comprises two more spans or bridges 16B and 16C that similarly span the diaphragm in a perpendicular direction to span 16A. In each case, the spans are connected to the frame 13.

In the embodiment shown in FIG. 3A, each span 16A, 16B and 16C includes a window 17 to reduce the amount of material included in the span. As may be seen in the figure, span 16A includes three windows 17 and spans 16B and 16C both include two windows 17. Moreover, where each of the spans 16A-16C crosses paths, the spans 16A-16C are connected to each other. The resulting support structure 16 creates a lattice type structure over the middle of the diaphragm 14 and is connected to the frame 13 along two perpendicular axes.

Numerous variations of the design may be incorporated into the support structure 16. Embodiments may have more or less spans 16A-16B. Each span may have fewer or more windows 17. The windows 17 may be of different shapes or sizes. The spans may run in different directions and may create lots of different shapes or patterns. The spans are not required to run directly across the diaphragm 14 from one side of the frame 13 to the other and may zig zag, change directions, snake or cross diaphragm in any number of ways. Preferably, the support structure 16 connects to the frame 13 along two perpendicular axes and has a portion that can limit the deflection of the diaphragm 14 near the center, which is the diaphragm's default position of maximum displacement.

FIG. 3B illustrates the underside of the cavity 18 and the underside of the diaphragm 14. As may be seen in the embodiment of FIG. 3B, the second material layer 20 was deposited over the entire bottom side including over the bottom of the cavity 18, the sides of the cavity 18 and the bottom of the frame 13.

Returning to the top view in FIG. 3A, a support structure 16 like the one shown may be created by masking and etching. In a preferred embodiment, the pressure sensor 10 is made from an SOI wafer and the insulator layer is used to determine the depth of the cavity and the top side etch that forms the diaphragm 14. For example, the cavity may be formed by etching up from the bottom to the insulator layer. The second material layer 20 is then deposited on the bottom and a second etch is performed from the top side down to the second material layer 20 using a mask to form the diaphragm 14 and support structure 16. More on the process and methods of manufacturing a pressure sensor as taught herein will be discussed below with respect to FIGS. 6 through 10.

FIG. 3A also illustrates the piezoresistors 15A-15F that are used to measure the displacement of the diaphragm 14. In the embodiment of FIG. 3A, at least one piezoresistor is formed in the silicon over the intersection of each of the support structure 16 spans 16A-16C with the frame 13. To this end, span 16A has piezoresistors 15C and 15C2 at one of its ends and 15F and 15F2 at its opposite end. Each of the piezoresistors spans an intersection between the support structure 16 and the frame 13 such that 15C2 and 15F2 are parallel to 15C and 15F, respectively. In the embodiment shown in FIG. 3A, each pair of piezoresistors on their respective sides are electrically connected in series to form a single resistor such that piezoresistors 15C and 15C2 are electrically connected in series. Similarly, piezoresistors 15F and 15F2 are electrically connected in series to form a single resistor.

Span 16B has piezoresistors 15B and 15D at each of its respective ends. Span 16C has piezoresistors 15A and 15E at each of its respective ends. In the embodiment shown in FIG. 3A, piezoresistors 15D and 15E are electrically connected in series to form a single resistor. Similarly, piezoresistors 15A and 15B are electrically connected in series to form a single resistor. In a preferred embodiment, the piezoresistors may be electrically connected to form a Wheatstone bridge. As may be appreciated, there are numerous ways to design, locate and electrically connect the embodiments without departing from the scope of the invention.

Similar to the defined flexibility discussed above with respect to the support structure 16, the placement and design of the piezoresistors may similarly vary. To this end, in other embodiments more or fewer resistors may be used than shown in FIG. 3A. Different electrical configurations and placements may be used along with different designs for the resistors themselves.

In operation, the pressures sensor 10 is configured to experience the pressure difference across the two sides of the diaphragm 14. This causes the diaphragm 14 to displace. Because the diaphragm 14 may be made so thin, the diaphragm 14 may be easily displace allowing construction of a very sensitive sensor 10 that can detect very low pressure differences. In operation, the support structure 16 provides two functions. First, the support structure 16 serves to limit the displacement of the diaphragm 14. In addition, when the diaphragm 14 flexes, it correspondingly flexes the support structure 16. The piezoresistors 15A-15F are positioned across the intersections of the support structure 16 and the frame 13 and measure the strain resulting from the displacement of the support structure 16 and thus, measure the pressure difference across the two sides of the diaphragm 14.

Figure 4A:
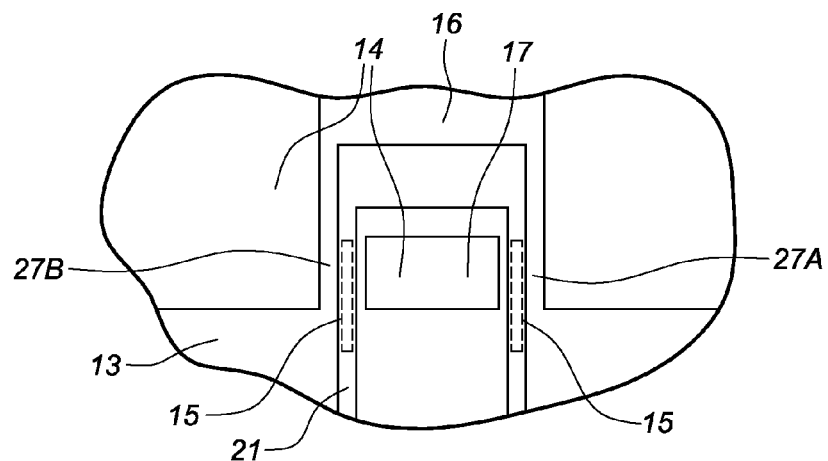
FIG. 4A illustrates a cut-out zoomed-in view of the intersection of the support structure 16 and the frame 13 at the edge of the diaphragm 14.

FIG. 4A illustrates a cut-out zoomed-in view of the intersection of the support structure 16 and the frame 13 at the edge of the diaphragm 14. The structure in FIG. 4A is an exemplary representation and many other designs may be used. As may be seen in FIG. 4A, the support structure may have a window 17 cut in the support structure 16 very near the edge of the diaphragm 14 in order to form two bridges 27A and 27B. The window 17 located in this position reduces the connected area between the support structure 16 and the frame 13 and allows the support structure 16 to more easily flex at this location. Accordingly, piezoresistors 15 may be run out from the frame 13 onto the support structure 16 along the bridges 27A and 27B and connected electrically with conductive material 21. In such an embodiment, a piezoresistor 15 may be placed on both bridges 27A and 27B such that two piezoresistors 15 connected electrically in series with conductive material 21 are present. In operation, when the support structure 16 is flexed, and in particular when the span is flexed, the piezoresistors 15 are flexed perpendicular to their longitudinal length. As is well known, as the piezoresistors are flexed, their resistivity is affected in proportion to the deflection. While this type of configuration with windows 17 and bridges 27 is desirable, it is not required and other configurations may be used.

Figure 4B:
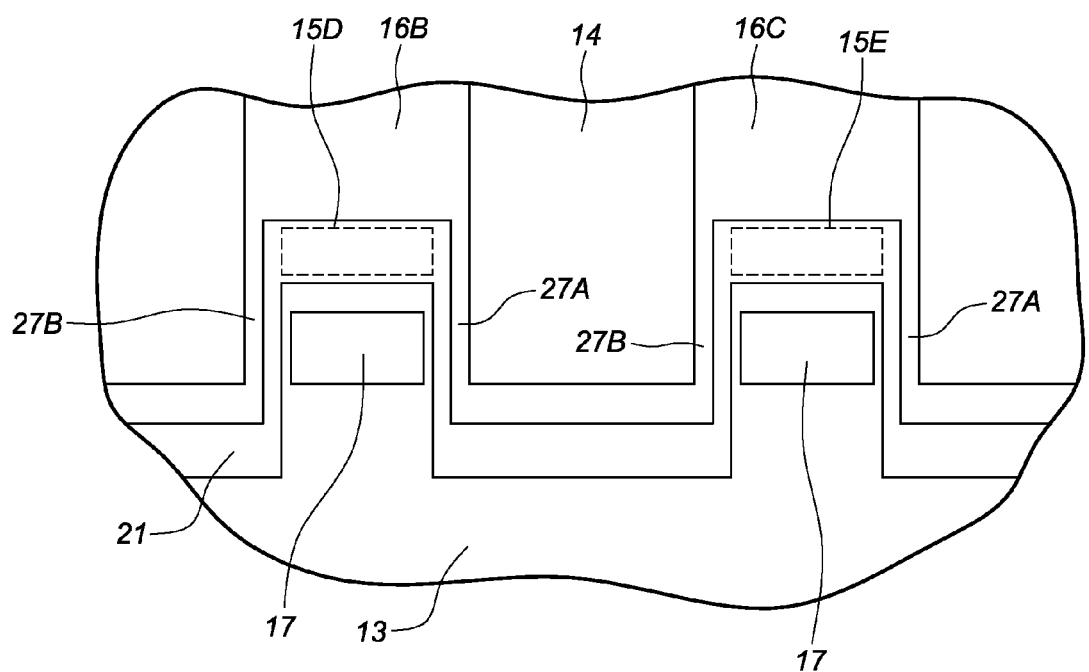
FIG. 4B illustrates another configuration of a pressure sensor where multiple spans of the support structure intersect with the frame on the same side of the pressure sensor.

FIG. 4B illustrates another configuration where multiple spans 16B and 16C from the support structure 16 intersect with the frame 13 on the same side of the pressure sensor 10. As may be seen, each span 16B and 16C of the support structure 16 includes a window 17 that creates corresponding bridges 27A and 27B. In this embodiment, even though multiple spans intersect on the same side, only two piezoresistors 15D and 15E are electrically connected in series by conductive span 21. Accordingly, only a single piezoresistor is used on each span. Moreover, the piezoresistors 15D and 15E are oriented and located differently than the embodiment in FIG. 4A. The conductive material 21 is run from the frame 13 out onto the first span 16B across bridge 27B. A piezoresistor 15D is then placed across the width of the span 16B as shown in FIG. 4B. The conductive material 21 is then run back again across the corresponding bridge 27B and along the frame 13 towards the second span 16C and in a similar manner, is run out onto the second span 16C. A second piezoresistor 15E is run across the width of span 16C as shown in FIG. 4B. Finally, the conductive material 21 is run back to the frame 13 over the corresponding bridge 27A of span 16C. Although the above configuration is described as two piezoresistive elements 15 connected in series, it may also be considered a single piezoresistor 15 configured over two separate spans 16B and 16C.

Unlike the configuration shown in FIG. 4A, in the embodiment of FIG. 4B, the piezoresistors 15D and 15E are flexed along a longitudinal axis. Ideally, the piezoresistors of FIGS. 4A and 4B are dimensioned and positioned to maximize the resistance change with the pressure difference that is applied to the diaphragm 14. Ideally, the resistance change of the piezoresistors of FIG. 4B are equal in magnitude but opposite in sign to the resistance change of the piezoresistors of FIG. 4A.

Figure 5A:
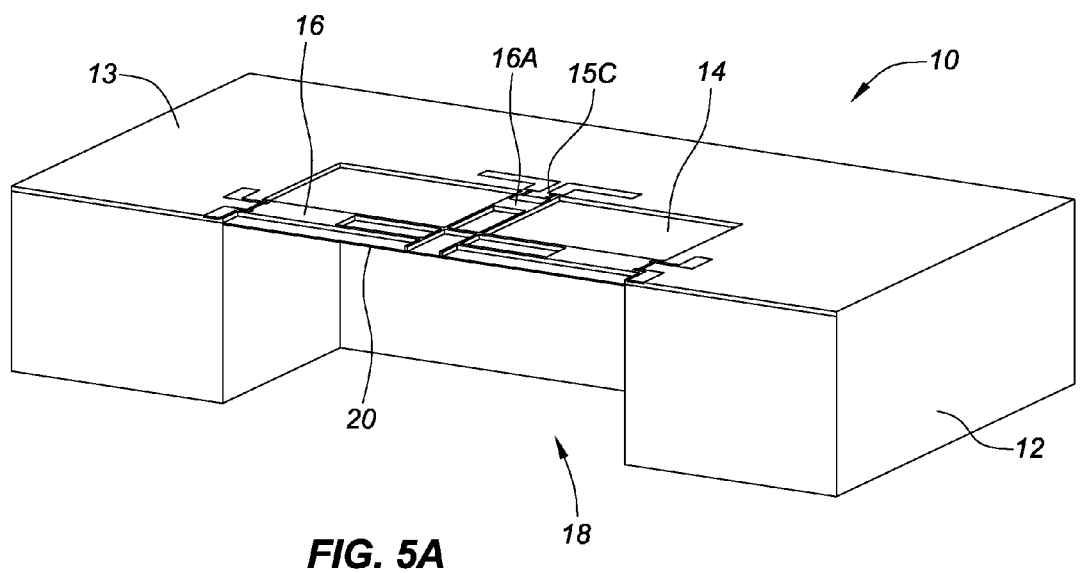
FIG. 5A illustrates a cross-sectional view of the pressure sensor 10 of FIG. 3A.

FIG. 5A illustrates a cross-sectional view of the pressure sensor 10 of FIG. 3A. As may be seen in FIG. 3A, the thickness of the second material layer 20 and the thickness of the support structure 16 is much thinner than the depth of the cavity 18.

Figure 5B:
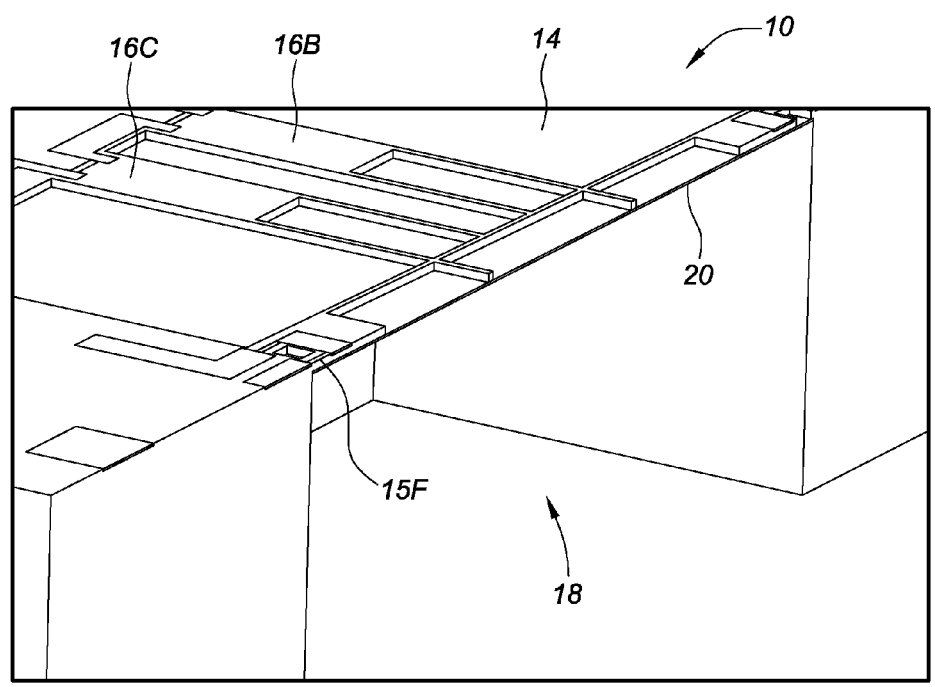
FIG. 5B illustrates a cross-sectional view of the pressure sensor 10 of FIG. 3A taken along an axis perpendicular to the cross-sectional view of FIG. 5A.

FIG. 5B illustrates a cross-sectional view of the pressure sensor 10 of FIG. 3A taken along an axis perpendicular to the cross-sectional view of FIG. 5A.

One method for making a pressure sensor with a diaphragm made from a second material layer will now be discussed with respect to FIGS. 6-10. Each of the FIGS. 6-10 is a representative view of the cross section of the pressure sensor at a different step along the manufacturing process.

Figure 6:
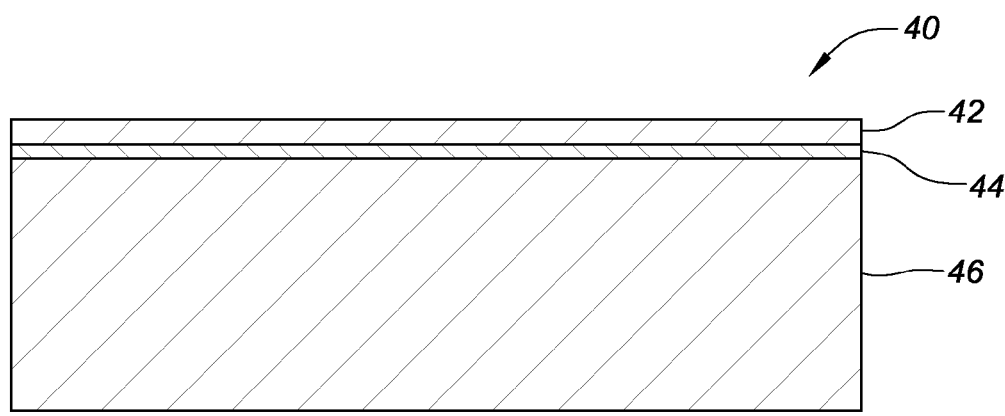
FIG. 6 illustrates a cross-sectional view of a pressure sensor during one step of the process of manufacturing.

FIG. 6 illustrates a cross-sectional view of an SOI wafer. Although using an SOI wafer is preferable, the pressure sensor may be built out of other materials or other silicon constructs. In preferred embodiments, the pressure sensor is constructed from a single crystal or monocrystalline solid or silicon construct that includes a plurality of single-crystal layers. As may be seen in FIG. 6, the SOI wafer includes a first silicon layer 42, an insulator layer 44 and a second silicon layer 46. In different embodiments, the thickness of each layer may vary. However, the top layer, which will eventually form the support structure, will typically be much thinner than the bottom layer which will house the cavity. In a preferred embodiment, the first silicon layer 42 is approximately 1 to 20 microns thick. The insulator layer 44 is approximately 0.1 to 3 microns thick and the second silicon layer 46 is approximately 300 to 1000 microns thick.

Figure 7:
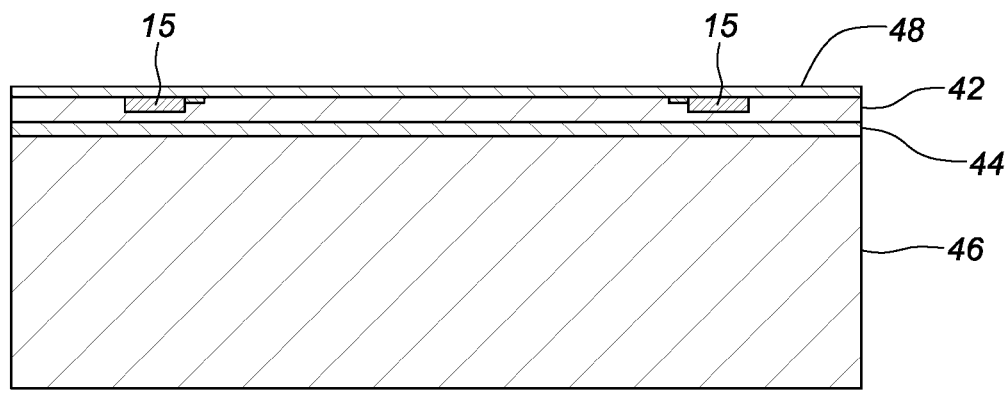
FIG. 7 illustrates a cross-sectional view of a pressure sensor during one step of the manufacturing process after the piezoresistive elements have been added.
Figure 8:
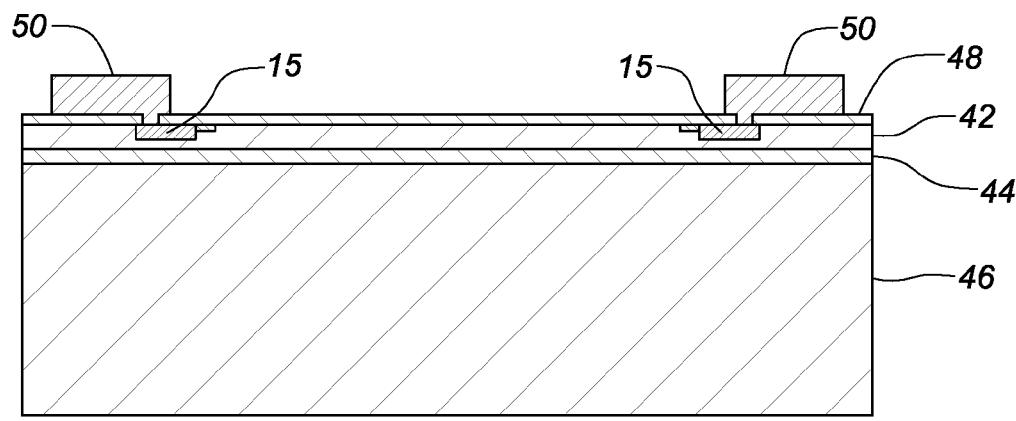
FIG. 8 illustrates a cross-sectional view of a pressure sensor during one step of the manufacturing process after the contacts have been formed.

FIG. 7 illustrates a cross-section of the pressure sensor after the piezoresistor elements 15 have been formed in the first silicon layer 42. In a typical process, this is formed by forming a P+ mask, followed by an oxide etch and then implanting the P+ material in the space formed by the oxide etch. A similar process is performed for the P− material in which a P−mask is formed and then an oxide etch is performed. The P− material is then implanted. Once the piezoresistive elements 15 have been implanted, a second layer of oxide 48 may be formed over the top surface using an oxide deposition. The entire part is then annealed.

After the piezoresistive elements 15 are formed, the contacts 50 need to be created to allow electrical connection to the piezoresistive elements 15. In a typical embodiment, the contacts 50 are created by performing a contact mask followed by a contact etch. These steps define the location of the contacts 50 and the contacts 50 are formed by next performing a metal deposition step. The metal may then be further masked and a metal etch is performed.

Figure 9:
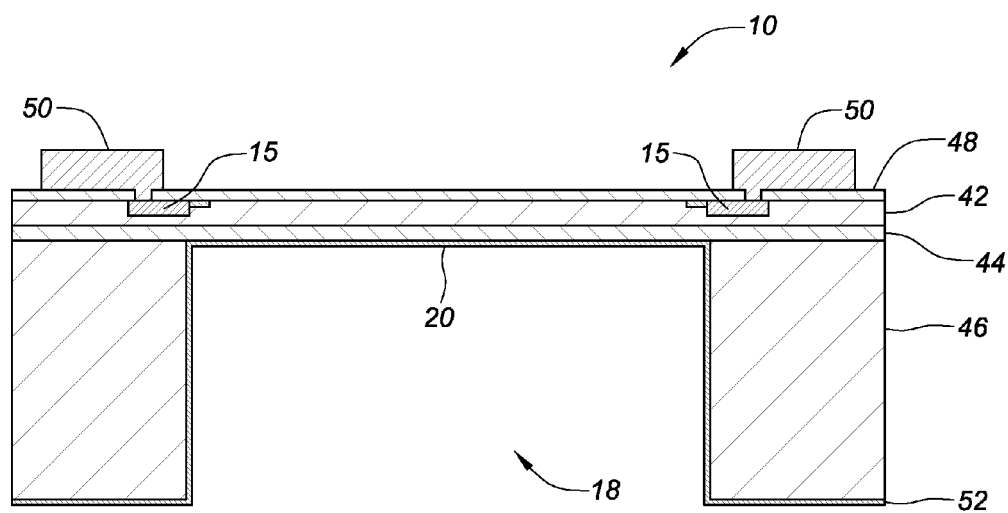
FIG. 9 illustrates a cross-sectional view of a pressure sensor during one step of the manufacturing process after the cavity has been formed and the second layer of material has been added.
Figure 9:
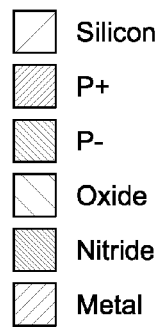

In the next part of the method, illustrated in FIG. 9, the cavity is formed. In order to form the cavity in a typical embodiment, a cavity mask is applied to the bottom silicon layer 46 and a cavity etch is performed. In preferred embodiments the cavity etch removes the silicon material all the way to the insulator layer 44 in the area of the cavity.

Once the cavity has been formed by etching away a portion of the bottom layer of silicon 46, the diaphragm may be formed (or what will shortly become the diaphragm after the top silicon layer 42 is etched.). In preferred embodiments, the diaphragm is formed after the cavity etch. In preferred embodiments, a separate layer of material is deposited over the entire bottom layer of the silicon 46. Preferably, the separate layer of material is a dielectric material and even move preferably silicon nitride. In order to facilitate the entire surface being covered with the separate layer of material, a photoresist strip may be performed to remove any masking set-up to define the cavity.

One potential benefit of the embodiments disclosed herein, is that the dielectric diaphragm can be selected or coated with a material that can withstand certain chemicals, such as strong bases for example, that a silicon diaphragm cannot. This may allow the embodiments described herein to be used in harsh environments and corrosive or toxic liquids or gases. However, in the preferred embodiments no diaphragm coating is needed and the pressure sensor is designed to measure ultra-low pressure for air flow measurement.

Figure 10:
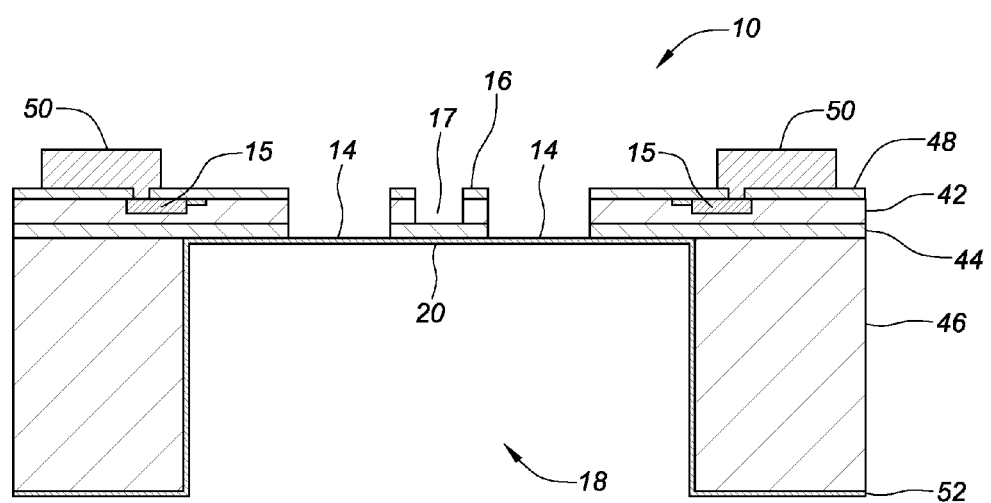
FIG. 10 illustrates a cross-sectional view of a pressure sensor during the final stage of the manufacturing process in which material above the diaphragm has been removed to form the diaphragm and the support structure.

In the final steps of the process illustrated in FIG. 10, the separate material layer 20 becomes a diaphragm 14 by removing portions of the material above the separate material layer 20. In typical embodiments, these steps are performed by first defining a diaphragm mask on the top surface of oxide 48. Although referred to here as a diaphragm mask, the mask defines both the outside edges of the diaphragm but also the complete shape of the support structure 16. This allows the support structure 16 to be made from a single-crystal silicon material, i.e., the top layer of silicon 42 of the SOI wafer, and be integrated with the frame 13.

Once the diaphragm mask is defined, an oxide etch is performed to remove oxide layer 48 where the diaphragm is defined. The oxide etch is followed by a silicon etch to remove the silicon layer 42 is the same areas. Finally, another oxide etch is performed to remove the oxide layer 44 in the same areas. Accordingly, all of the material of the SOI wafer is removed above the second material layer 20, where the diaphragm is defined to be.

As may be seen in FIG. 10, the support structure is formed at the same time from the remaining material masked off and not etched away. In some embodiments, portions of the support structure may include a window 17. In some of these embodiments, the window may not penetrate all the way to the second material layer 20 but may instead may be formed by removing only oxide layer 48 and silicon layer 42.

To this end, a piezoresistive pressure sensor having an ultrathin diaphragm made of silicon nitride (or other suitable material) and with a support frame made out of the single-crystal starting material may be formed. Given the methods and techniques discussed above, the pressure sensor may be considered a MEMS device. In preferred embodiments, the piezoresistors are made out of the same single-crystal silicon layer as the support structure 16. The designs described and taught herein give a high signal output with good linearity while being able to withstand high overpressure.

Although the embodiments have been described with reference to preferred configurations and specific examples, it will readily be appreciated by those skilled in the art that many modifications and adaptations of the pressure sensor and related methods are possible without departure from the spirit and scope of the embodiments as claimed hereinafter. Thus, it is to be clearly understood that this description is made only by way of example and not as a limitation on the scope of the embodiments as claimed below.

What is claimed is:

1. A pressure sensor comprising:
   a frame made from a single-crystal silicon starting material, the frame surrounding a cavity;
   a diaphragm that covers the cavity, the diaphragm constructed from a separate layer of material deposited on the single-crystal silicon starting material;
   a support structure that spans the diaphragm wherein the support structure is formed from the single-crystal starting material; and,
   a piezoresistor formed across an intersection of the frame and the support structure.

2. The pressure sensor of claim 1, wherein the separate layer of material is a dielectric material.

3. The pressure sensor of claim 2, wherein the separate layer of material is silicon nitride.

4. The pressure sensor of claim 1, wherein the piezoresistor is formed in the single-crystal silicon material.

5. The pressure sensor of claim 4, wherein the piezoresistor is formed by implanting a P+ material and a P− material in the single-crystal silicon material, which is N-type.

6. The pressure sensor of claim 4, wherein the piezoresistor is formed by implanting a P+ material in the single-crystal silicon material, which is N-type.

7. The pressure sensor of claim 1, wherein the single-crystal starting material is part of a silicon-on-insulator (SOI) wafer.

8. The pressure sensor of claim 7, wherein the cavity is formed in the silicon on a first side of the insulator and the support structure is formed in the silicon on a second opposite side of the insulator.

9. The pressure sensor of claim 1, wherein the support structure is comprised of two spans that span the diaphragm in perpendicular directions to each other.

10. The pressure sensor of claim 1, wherein the support structure includes at least one window.

11. The pressure sensor of claim 1, wherein the diaphragm is smaller than the cavity.

12. The pressure sensor of claim 1, wherein the support structure comprises two spans in one direction and a third span in a second direction perpendicular to the first two spans.

13. The pressure sensor of claim 10, wherein the support structure comprises a plurality of windows and one of the windows is over the center of the diaphragm.

14. The pressure sensor of claim 9, further comprising a piezoresistor formed at each intersection of the spans and the frame.

15. The pressure sensor of claim 1, wherein the diaphragm is coated with a corrosion resistant coating.

16. A pressure sensor formed from a silicon-on-silicon (SOI) wafer comprising:
   a cavity formed in the silicon on a first side of the insulator and extending all the way to the insulator;
   a diaphragm formed within the cavity, the diaphragm formed from a separate layer of material deposited on the first side of the SOI wafer;
   a support structure formed from the silicon on a second opposite side of the insulator from the first side wherein the support structure spans the diaphragm and is formed by removing silicon on the second opposite side of the SOI wafer above the cavity and leaving the support structure; and,
   a piezoresistor formed across an intersection of the support structure and the SOI wafer at an outside edge of the diaphragm.

17. The pressure sensor of claim 16, wherein the separate layer of material is silicon nitride.

18. The pressure sensor of claim 16, wherein the support structure is formed from the silicon on the second opposite side of the SOI wafer.

19. The pressure sensor of claim 16, wherein the piezoresistor is formed by implanting a P+ material and a P− material in the single-crystal silicon material, which is N-type.

20. The pressure sensor of claim 16, wherein the piezoresistor is formed by implanting a P+ material in the single-crystal silicon material, which is N-type.

21. The pressure sensor of claim 16, wherein the support structure comprises two spans that span the diaphragm in perpendicular directions to each other.

22. The pressure sensor of claim 16, wherein the support structure includes at least one window.

23. The pressure sensor of claim 22, wherein the support structure includes a plurality of windows with at least one window positioned over the center of the diaphragm.

24. The pressure sensor of claim 10, wherein the support structure includes a plurality of windows with at least one window positioned over the center of the diaphragm.

* * * * *